(12) United States Patent
Sagawa et al.

(10) Patent No.: US 12,379,892 B2
(45) Date of Patent: Aug. 5, 2025

(54) AUDIO SIGNAL PROCESSING DEVICE, AUDIO SIGNAL PROCESSING METHOD, AND PROGRAM

(71) Applicant: AlphaTheta Corporation, Yokohama (JP)

(72) Inventors: Kenta Sagawa, Yokohama (JP); Mitsunobu Endo, Yokohama (JP); Syunsuke Otani, Yokohama (JP); Yusuke Tsuda, Yokohama (JP); Shinya Koizumi, Yokohama (JP)

(73) Assignee: ALPHATHETA CORPORATION, Yokohama (JP)

( * ) Notice: Subject to any disclaimer, the term of this patent is extended or adjusted under 35 U.S.C. 154(b) by 267 days.

(21) Appl. No.: 18/044,131

(22) PCT Filed: Sep. 7, 2020

(86) PCT No.: PCT/JP2020/033744
§ 371 (c)(1),
(2) Date: Mar. 6, 2023

(87) PCT Pub. No.: WO2022/049761
PCT Pub. Date: Mar. 10, 2022

(65) Prior Publication Data
US 2023/0333806 A1  Oct. 19, 2023

(51) Int. Cl.
*G10H 1/40* (2006.01)
*G06F 3/16* (2006.01)

(52) U.S. Cl.
CPC .................... *G06F 3/162* (2013.01)

(58) Field of Classification Search
CPC ........ G06F 3/162; G10H 1/0091; G10H 1/40; G10H 2210/00; G10H 2210/125; G10H 2210/265

USPC ............................................... 381/61, 63, 66
See application file for complete search history.

(56) References Cited

U.S. PATENT DOCUMENTS

| | | | |
|---|---|---|---|
| 5,530,762 | A | 6/1996 | Jones, Jr. et al. |
| 2004/0194613 | A1 | 10/2004 | Kusumoto |
| 2020/0126528 | A1 | 4/2020 | Packouz |

FOREIGN PATENT DOCUMENTS

| | | |
|---|---|---|
| JP | 51-147001 U | 11/1976 |
| JP | 61-169897 A | 7/1986 |
| JP | 64-32599 U | 3/1989 |
| JP | 4-181992 A | 6/1992 |
| JP | 8-6584 A | 1/1996 |
| JP | 8-30271 A | 2/1996 |
| JP | 9-244640 A | 9/1997 |
| JP | 2004-309725 A | 11/2004 |
| JP | 2010-500834 A | 1/2010 |
| JP | 2015-087686 A | 5/2015 |

(Continued)

OTHER PUBLICATIONS

Japanese Office Action dated Dec. 10, 2024, Application No. 2022-546849; English translation included, 10 pages.

(Continued)

*Primary Examiner* — George C Monikang
(74) *Attorney, Agent, or Firm* — Rankin, Hill & Clark LLP

(57) ABSTRACT

Provided is an audio signal processing apparatus including: a first buffer configured to temporarily store an audio signal; a feedback path whose start point and end point are located close to an output side of the first buffer; and a second buffer connected in the feedback path and configured to temporarily store the audio signal.

7 Claims, 3 Drawing Sheets

(56) References Cited

FOREIGN PATENT DOCUMENTS

| JP | 2016-173389 A | 9/2016 |
| WO | 2019/234861 A1 | 12/2019 |
| WO | 2019/239486 A1 | 12/2019 |
| WO | 2019/239538 A1 | 12/2019 |

OTHER PUBLICATIONS

International Preliminary Report on Patentability dated Mar. 7, 2023, Application No. PCT/JP2020/033744, 5 pages.
Extended European Search Report dated May 17, 2024, Application No. 20952495.8; 12 pages.
Japanese Office Action dated Jun. 4, 2024, Application No. 2022-546849; English translation included, 7 pages.
International Search Report dated Nov. 24, 2020, Application No. PCT/JP2020/033744; English translation Included, 5 pages.

AUDIO SIGNAL PROCESSING DEVICE, AUDIO SIGNAL PROCESSING METHOD, AND PROGRAM

TECHNICAL FIELD

The present invention relates to an audio signal processing apparatus, an audio signal processing method, and a program.

BACKGROUND ART

Various techniques for improving functionality and/or operability of sound devices (e.g. controllers and mixers) used for DJ performance have been proposed. Examples of such techniques are disclosed in, for instance, Patent Literatures 1, 2 and 3.

CITATION LIST

Patent Literature(S)

Patent Literature 1: WO 2019/239538 A
Patent Literature 2: WO 2019/239486 A
Patent Literature 3: WO 2019/234861 A

SUMMARY OF THE INVENTION

Problem(S) to be Solved by the Invention

The typical techniques as those disclosed in the above literatures, which are implemented with functionality for playing the music piece by applying effects (e.g. delay, echo, reverb, and loop) on a music piece using a buffer for temporarily storing audio signals, are configured to apply various effects on the music piece during DJ performance. However, it is sometimes difficult to appropriately apply such effects when, for instance, complicated playing operations are to be performed on the music piece during the DJ performance. Accordingly, there are some improvements to be made in applying effect on a music piece with the use of a buffer.

In view of the above, an object of the invention is to provide an audio signal processing apparatus, an audio signal processing method, and a program that are capable of improving effects applied on a music piece using a buffer.

Means for Solving the Problem(S)

[1] An audio signal processing apparatus including: a first buffer configured to temporarily store an audio signal; a feedback path whose start point and end point are located close to an output side of the first buffer; and a second buffer connected in the feedback path and configured to temporarily store the audio signal.
[2] The audio signal processing apparatus according to [1], further including a gate connected to the output side of the first buffer and not connected in the feedback path.
[3] The audio signal processing apparatus according to [2], in which the gate is turned on when a predetermined trigger operation is performed and is turned off when the audio signal of a predetermined time length is transmitted.
[4] The audio signal processing apparatus according to any one of [1] to [3], in which a delay time of the audio signal by the second buffer is not more than a delay time of the audio signal by the first buffer.
[5] The audio signal processing apparatus according to any one of [1] to [4], further including a variable amplifier or an attenuator connected in the feedback path.
[6] The audio signal processing apparatus according to any one of [1] to [5], in which the second buffer includes a plurality of buffers connected in parallel.
[7] An audio signal processing method including: temporarily storing an inputted audio signal in a first buffer; outputting the audio signal stored in the first buffer and temporarily storing the outputted audio signal in a second buffer; and outputting the audio signal stored in the second buffer and feeding back the audio signal to the second buffer.
[8] The audio signal processing method according to [7], further including amplifying or attenuating the audio signal fed back to the second buffer.
[9] A program configured to allow a computer to function as an audio signal processing apparatus including: a first buffer configured to temporarily store an audio signal; a feedback path whose start point and end point are located close to an output side of the first buffer; and a second buffer connected in the feedback path and configured to temporarily store the audio signal.

According to the above aspects of the invention, the audio signal stored in the first buffer at the time of the trigger operation is inputted to the feedback path including the second buffer after the trigger operation is performed. Accordingly, the audio signal of the music piece played before the trigger operation can be repeatedly played in a form of an effect sound. An independent operation for switching the effect on at a start point of a section of the music piece to be played as the effect sound is thus not necessary but a section before the trigger operation can be easily repeatedly played in a form of the effect sound.

DESCRIPTION OF EMBODIMENT(S)

Figure 1:
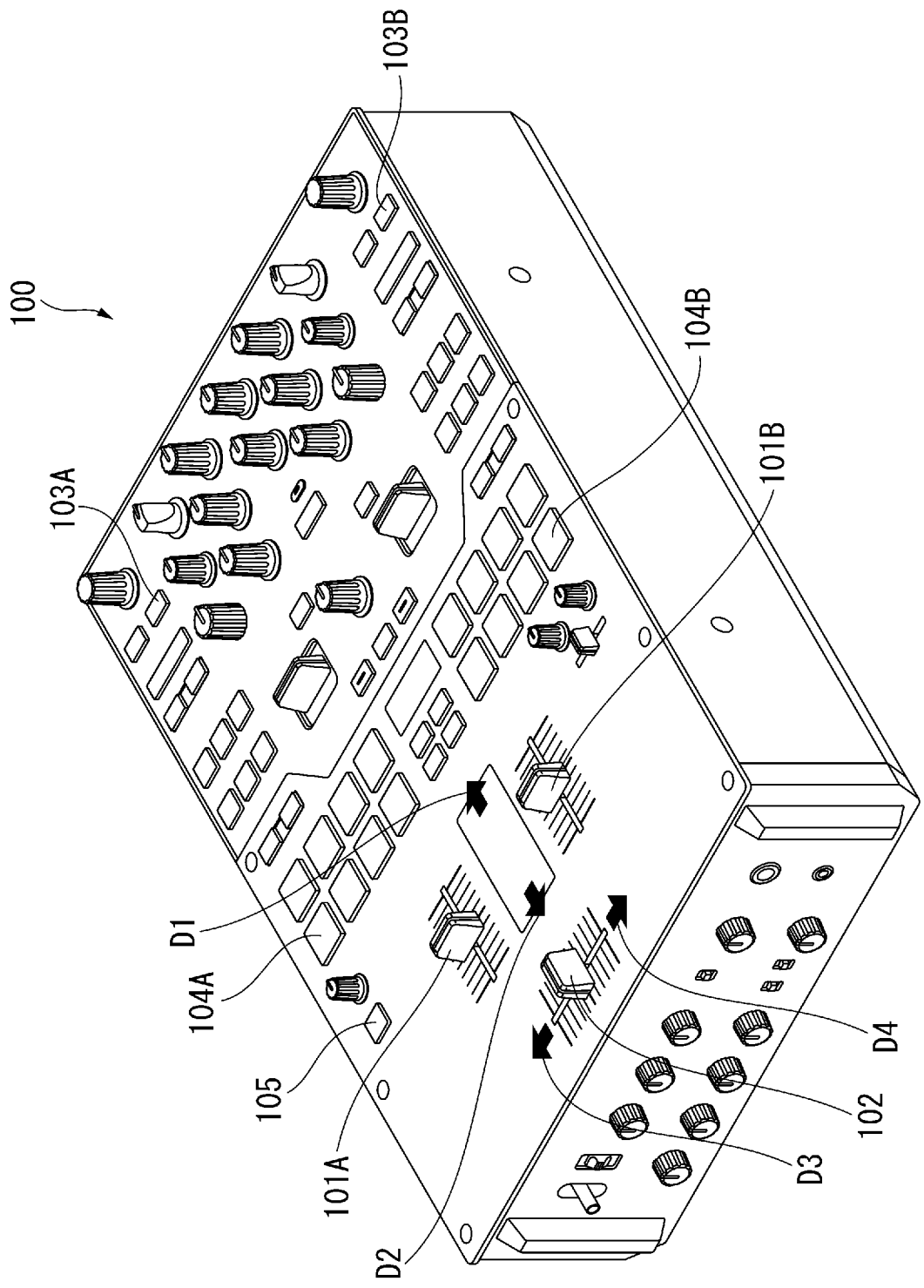
FIG. 1 illustrates an overall structure of a mixer according to an exemplary embodiment of the invention.

Suitable exemplary embodiment(s) of the invention will be described in detail below with reference to the attached drawings. It should be noted that components of the same or substantially the same function(s) and structure(s) will be denoted by the same reference numerals in the specification and drawings, omitting repetition of description thereof.

FIG. 1 illustrates an overall structure of a mixer according to an exemplary embodiment of the invention. An audio signal processing apparatus according to the present exemplary embodiment is embodied as a mixer 100 used for DJ performance. The mixer 100 is configured to process 2-channel audio signals inputted from an external audio source in accordance with an operation performed on control units (e.g. switch and knob) installed in a casing and output the processed audio signals to a speaker or the like. The control units of the mixer 100 include channel faders 101A, 101B, a cross fader 102, load buttons 103A, 103B, and performance pads 104A, 104B. The channel faders 101A, 101B are configured to be slid in directions D1, D2 (see FIG. 1) to gradually change sound volume of the music piece to be played in the corresponding one of channels, where the sound volume of each of the channels becomes 0 when the corresponding one of the channel faders 101A, 101B is slid to an end of the movable range thereof in the direction D2.

In contrast, the cross fader 102 is configured to adjust the balance of the music pieces played in the respective channels. Supposing that the channel controlled by the channel fader 101A is an A channel and the channel controlled by the channel fader 101B is a B channel, the sound volume of the music piece of the B channel becomes 0 when the cross fader 102 is slid to an end in an illustrated direction D3, the sound volume of the music piece of the A channel becomes 0 when the cross fader 102 is slid to an end in an illustrated direction D4, and the music pieces of the channels are played at respective sound volumes (>0) in an intermediate part.

The load buttons 103A, 103B are used for an operation for loading the music pieces to be played through the respective channels. Further, the performance pads 104A, 104B are used to perform function(s) (e.g. hot cue) assigned by user's setting on the music pieces played through the respective channels.

The control units of the mixer 100 additionally include a button 105 for enabling later-described effect function. It should be noted that the details of the control units of the mixer 100 including the above faders and buttons, which are the same as those of typical mixers except for being used for the later-described effect function, will not be described below.

Figure 2:
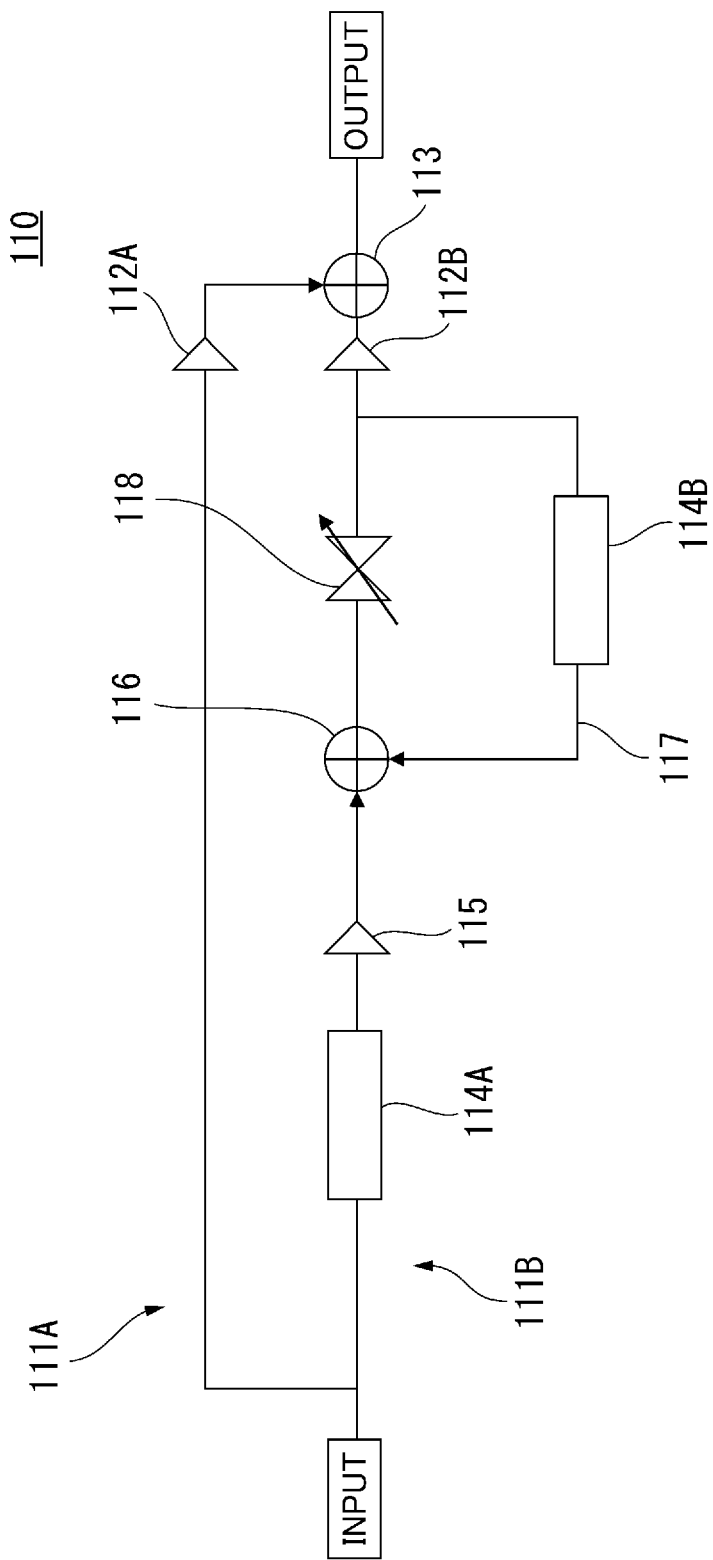
FIG. 2 illustrates a structure of an effect circuit of the mixer shown in FIG. 1.

FIG. 2 illustrates a structure of an effect circuit of the mixer shown in FIG. 1. It should be noted that the processing circuit of the audio signals of the mixer 100 is in a form of software implemented with the use of a CPU (Central Processing Unit) or DSP (Digital Signal Processor). The effect circuit 110 as illustrated is connected to a downstream of sound-volume adjustment processing by the faders in each of the A and B channels of the mixer 100. Accordingly, the results of the sound-volume adjustment by the channel faders 101A, 101B and the cross fader 102 are reflected on the audio signals inputted to the effect circuit 110. Specifically, for instance, when one of the channel faders 101A, 101B is slid to the end in the direction D2 shown in FIG. 1, an audio signal (no signal: sound volume 0) is inputted to the corresponding one of the channels, and when the cross fader 102 is slid to the end in one of the directions D3, D4, an audio signal (no signal: sound volume 0) is inputted to the corresponding one of the channels. The structure of the components of the effect circuit 110 will be further described below.

The effect circuit 110 includes transmission paths 111A, 111B connected in parallel. The transmission path 111A, which is a bypass path, transmits an audio signal of an original (i.e. non-effected) sound. The transmission path 111B, which includes later-described circuit components for applying effect, transmits audio signal of an effect sound. The original sound and the effect sound, whose balance is controlled by amplifiers 112A, 112B, are added by an adder 113 to be outputted. A buffer 114A is connected to the transmission path 111B. The buffer 114A is configured to temporarily store the inputted audio signal and output the temporarily stored audio signal. A gate 115 is connected to an output side of the buffer 114A. Herein, the gate refers to a circuit component (implemented in a form of software, as described above) that allows and blocks signal transmission when being on and off, respectively. The gate 115 is turned on when a later-described trigger operation for the effect is performed and is turned off when an audio signal of a predetermined time length is transmitted.

The volume of the buffers 114A, 114B connected to the effect circuit 110 is optionally variable. Delay time from input to output of the audio signal into and out of the buffers 114A, 114B can be changed by controlling the volume of the buffers 114A, 114B. In this case, the volume of the buffers 114A, 114B is optionally automatically set so that the delay time becomes, for instance, n or 1/n times (n: integer) as long as the beat interval of the music piece currently played. The delay time of the audio signal caused by the buffer 114B is optionally not more than the delay time of the audio signal caused by the buffer 114A. The time length of the audio signal transmitted until the gate 115 is turned off is also optionally automatically set so that the time length becomes, for instance, n or 1/n times as long as the beat interval of the music piece currently played. Further, the on/off timing of the gate 115 is optionally automatically controlled to match the beat interval of the currently played music piece.

Further, a feedback path 117, whose start point and end point are located close to an output side of the buffer 114A, is connected to the transmission path 111B. The buffer 114B is connected in the feedback path 117. Specifically, the feedback path 117 is branched from an upstream side of an amplifier 112B connected at an end of the transmission path 111B to be connected to an adder 116 at an output side of the gate 115. The gate 115 is not connected in the feedback path 117. Similar to the buffer 114A, the buffer 114B is also configured to temporarily store the inputted audio signal and output the temporarily stored audio signal. While the gate 115 is on, the audio signal stored in the buffer 114A is outputted in a form of the effect sound through the adder 113 and, additionally, is also stored in the buffer 114B through the feedback path 117. The audio signal stored in the buffer 114B is outputted in a form of the effect sound through the adder 113 and, additionally, is again stored in the buffer 114B through the feedback path 117. The audio signal stored in the buffer 114B is thus repeatedly played at a predetermined delay time.

Further, a variable amplifier 118 or an attenuator is connected between the adder 116 and a branch point of the feedback path 117 in the present exemplary embodiment. When an amplification rate of the variable amplifier 118 is less than 1 or an attenuator is connected, the repeatedly played effect sound is gradually attenuated (fade-out). In contrast, when the amplification rate of the variable amplifier 118 exceeds 1, the effect sound is gradually amplified (fade-in). Alternatively, when the variable amplifier 118 is not provided or the amplification rate is 1, the effect sound continues to be repeatedly played at the same sound volume (loop).

Figure 3:
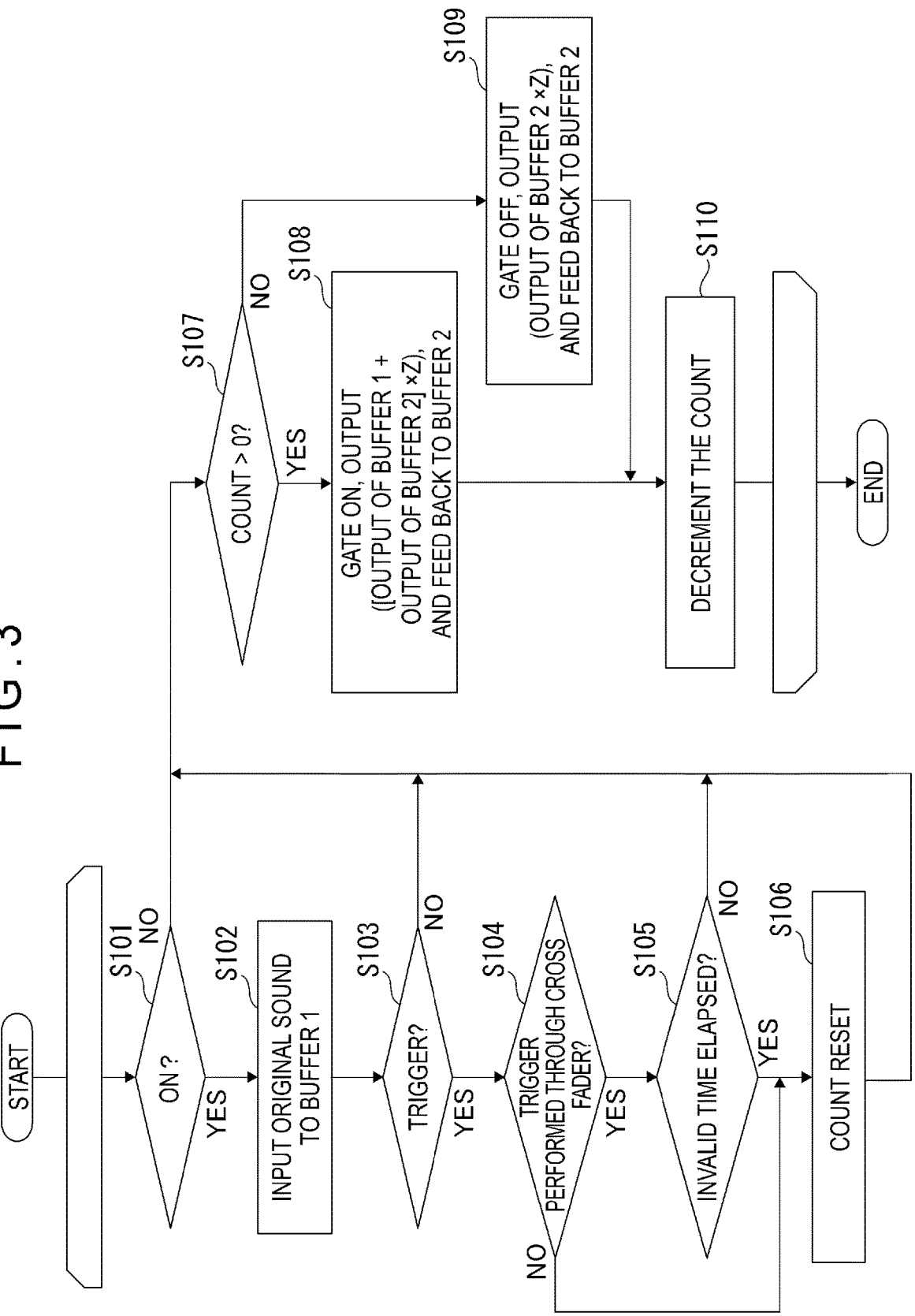
FIG. 3 is a flowchart showing an example of a process performed in the effect circuit shown in FIG. 2.

FIG. 3 is a flowchart showing an example of a process performed in the effect circuit shown in FIG. 2. For instance, below-described processes are repeatedly performed while the music pieces are played in respective channels. Initially, whether the effect function is on by pushing the button 105 shown in FIG. 1 is judged (Step S101). When the effect function is on (YES), the original sound is inputted into the buffer 1 (the above-described buffer 114A) (Step S102). Subsequently, whether the trigger operation is performed is judged (Step S103). Herein, examples of the trigger operation optionally include at least one of the above-described operation for lowering the sound volume of the channels to 0 by the channel faders 101A, 101B and the cross fader 102, an operation for loading the music piece by the load buttons 103A, 103B, and hot-cue operation using the performance pads 104A, 104B. Additionally or alternatively, gate-cue, silent cue, and/or muting operations performed using a control unit such as the performance pads 104A, 104B and/or other button(s) are also optionally the trigger operation for the effect in some embodiments.

When it is judged in the above Step S103 that the trigger operation is performed (YES), it is further judged whether the trigger operation is performed through the cross fader 102 (Step S104). When it is judged that the trigger operation is performed through the cross fader 102 (YES), it is judged whether a predetermined invalid time has elapsed (Step S105). Herein, the invalid time refers to a time elapsed from a preceding trigger operation through the cross fader 102. A subsequent trigger operation performed through the cross fader 102 before the invalid time elapses is ignored. When it is judged that the trigger operation is not performed through the cross fader 102 (Step S104: NO) or the invalid time has elapsed (Step S105: YES), a count is reset (S106). The count corresponds to a length of remaining time of the audio signal transmitted after the gate 115 is turned on and before the gate 115 is turned off. In contrast, when it is judged in the above Steps S101, S103, S105 that the effect function is not on, the trigger operation is not performed, or the invalid time has not elapsed, the process proceeds to the next step without resetting the count. It should be noted that the above-described control depending on the invalid time is useful in, for instance, an operation using the cross fader 102 in combination with scratching.

Subsequently, whether the count is 0 or more is determined (Step S107). Herein, the count is decremented in subsequent Step S110 per one cycle of the illustrated process and will finally become 0 unless being reset. When the count is more than 0 (YES), the gate 115 is on. In this case, the audio signal, which is generated by adding the output of the buffer 1 (buffer 114A) and the output of the buffer 2 (buffer 114B) by the adder 116 and by multiplying the sum of the outputs by an amplification rate Z of the variable amplifier 118, is outputted through the adder 113 and is also fed back to the buffer 2 (buffer 114B) through the feedback path 117 (Step S108). In contrast, when it is judged in Step S107 that the count is 0 (NO), the gate 115 is off. In this case, the output of the buffer 1 (buffer 114A) is not inputted to the adder 116 but the output of the buffer 2 (buffer 114B), which is amplified or attenuated by the variable amplifier 118 and is outputted through the adder 113, is fed back to the buffer 2 (buffer 114B) through the feedback path 117 (Step S109). After the process in the above Step S108 or Step S109, the count is decremented (Step S110).

Through repetition of the above processes, the gate 115 is turned on by an effective trigger operation, so that the output of the buffer 114A of a predetermined time length is inputted to the feedback path 117 including the buffer 114B. The gate 115 is turned off after the audio signal of a predetermined time length is transmitted without a second effective trigger operation, so that the audio signal outputted so far from the buffer 114A is repeatedly played in the feedback path 117 including the buffer 114B. With the use of an attenuator or the variable amplifier 118 whose amplification rate Z is less than 1 to attenuate the audio signal fed back to the buffer 114B, effect of a certain type (e.g. delay, echo, and reverb) can be applied on a music piece. It should be noted that effect of another type (e.g. loop) can be applied when the amplification rate Z of the variable amplifier 118 is 1 or more or the variable amplifier 118 is not provided.

In the effect circuit 110, the audio signal stored in the buffer 114A at the time of the trigger operation is inputted to the feedback path 117 including the buffer 114B after the trigger operation is performed. Accordingly, the audio signal of the music piece played before the trigger operation can be repeatedly played in a form of the effect sound. An independent operation for switching the effect on at a start point of a section of the music piece to be played as the effect sound is thus not necessary but a section before the trigger operation can be easily repeatedly played in a form of the effect sound only by, for instance, the trigger operation through the channel faders 101A, 101B and/or the cross fader 102. The start point and end point of the section to be repeatedly played are automatically determined depending on the volume of the buffers 114A, 114B and the setting of the gate 115. Accordingly, an operation for determining the end point of the section is also not necessary. The section to be repeatedly played is limited. Accordingly, a plurality of effect sounds can be superposed with a single buffer 114B, thereby reducing processing load. It should be noted that, for instance, when different attenuation rates are to be set each time the music piece is repeatedly played, the buffer 114B is optionally provided by a plurality of parallel-connected buffers with corresponding variety of attenuation rates for the inputted audio signal.

When the gate 115 is provided, new audio signal is inputted to the feedback path 117 including the buffer 114B only while the gate 115 is on. Accordingly, even when another music piece is to be played after the trigger operation, the sound of the music piece played after the trigger operation can be kept from being superposed on the effect sound. Specifically, when the development of the music piece is greatly changed by, for instance, hot-cue function, effect such as echo can be applied using the sound before the development change, so that the music pieces can be connected without causing uncomfortable feeling. It should be noted that, when the trigger operation is an operation for muting the channels (sound volume=0), since no new audio signal is inputted to the buffer 114A after the trigger operation, the same process can be performed without providing the gate 115.

It should be noted that the audio signal processing apparatus with the above functionality is not necessarily the mixer as described in the exemplary embodiment but is optionally, for instance, a DJ controller with mixer function in some embodiments. The mixer, which is a 2-channel mixer in the above exemplary embodiment, is optionally a 4-channel mixer for achieving the same functionality. Further, the invention is not necessarily embodied in a DJ device but is also applicable to a typical mixer and a sound device (e.g. electronic instrument).

Suitable exemplary embodiments of the invention have been detailed above with reference to the attached drawings. However, the scope of the invention is not limited by the exemplary embodiments. It would be obvious for those skilled in the art to which the invention pertains that various modifications and revisions are conceivable within the technical idea defined by claims, and it is understood that such modifications and revisions are naturally within the technical scope of the invention.

The invention claimed is:
1. An audio signal processing apparatus comprising:
 a first buffer configured to temporarily store an audio signal;
 a feedback path whose start point and end point are located on an output side of the first buffer;
 a second buffer connected in the feedback path and configured to temporarily store the audio signal; and
 a gate connected to the output side of the first buffer and not connected in the feedback path, wherein the gate is turned on when a predetermined trigger operation is performed and is turned off when the audio signal of a predetermined time length is transmitted.

2. The audio signal processing apparatus according to claim 1, wherein a delay time of the audio signal by the second buffer is not more than a delay time of the audio signal by the first buffer.

3. The audio signal processing apparatus according to claim 1, further comprising a variable amplifier or an attenuator connected in-outside the feedback path.

4. The audio signal processing apparatus according to claim 1, wherein the second buffer comprises a plurality of buffers connected in parallel.

5. An audio signal processing method comprising:
temporarily storing an inputted audio signal in a first buffer;
turning on a gate connected to an output side of the first buffer to output the audio signal stored in the first buffer and temporarily store the outputted audio signal in a second buffer;
turning off the gate when the audio signal of a predetermined time length is transmitted; and
outputting the audio signal stored in the second buffer and feeding back the audio signal to the second buffer.

6. The audio signal processing method according to claim 5, further comprising amplifying or attenuating the audio signal fed back to the second buffer.

7. A non-transitory tangible recording medium recording a program configured to cause a computer to function as an audio signal processing apparatus comprising:
a first buffer configured to temporarily store an audio signal;
a feedback path whose start point and end point are located on an output side of the first buffer;
a second buffer connected in the feedback path and configured to temporarily store the audio signal; and
a gate connected to the output side of the first buffer and not connected in the feedback path,
wherein the gate is turned on when a predetermined trigger operation is performed and is turned off when the audio signal of a predetermined time length is transmitted.

* * * * *